(12) United States Patent
Delos

(10) Patent No.: US 9,473,158 B1
(45) Date of Patent: Oct. 18, 2016

(54) RADIO FREQUENCY RECEIVER WITH OVERLAPPED ANALOG TO DIGITAL CONVERTER (ADC) ARCHITECTURE

(71) Applicant: Lockheed Martin Corporation, Bethesda, MD (US)

(72) Inventor: Peter L. Delos, Mount Laurel, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 14/870,250

(22) Filed: Sep. 30, 2015

(51) Int. Cl.
*H03M 1/12* (2006.01)
*H04B 1/06* (2006.01)

(52) U.S. Cl.
CPC ........ *H03M 1/12* (2013.01); *H04B 1/06* (2013.01)

(58) Field of Classification Search
CPC ........ H04B 1/28; H04B 1/005; H04B 1/006; H03M 1/0614; H03M 1/1042; H03M 1/12
USPC .......... 341/155; 455/63.1, 182.3, 285, 236.1, 455/343.1; 375/319, 316
See application file for complete search history.

(56) References Cited

U.S. PATENT DOCUMENTS

| | | | |
|---|---|---|---|
| 6,342,850 B1 | 1/2002 | Borer et al. | |
| 6,473,013 B1 | 10/2002 | Velazquez et al. | |
| 6,778,117 B1 * | 8/2004 | Johnson | H03C 3/403 341/118 |
| 6,778,125 B1 | 8/2004 | Stewart et al. | |
| 6,825,789 B1 | 11/2004 | Stewart et al. | |
| 7,228,109 B2 * | 6/2007 | Paulus | H04B 1/0003 455/236.1 |
| 7,558,546 B2 * | 7/2009 | Johnson | H03D 7/166 455/182.3 |
| 7,643,600 B2 * | 1/2010 | Maxim | H03C 3/40 375/316 |
| 7,675,996 B2 * | 3/2010 | Johnson | H03D 7/00 375/316 |
| 7,979,048 B2 * | 7/2011 | Kerth | H04W 52/028 455/343.1 |
| 2006/0141969 A1 * | 6/2006 | Dubash | G01S 19/32 455/285 |
| 2007/0099570 A1 * | 5/2007 | Gao | H04B 1/30 455/63.1 |
| 2010/0061485 A1 * | 3/2010 | Clark | H04B 1/30 375/319 |
| 2012/0007651 A1 * | 1/2012 | Meng | H03K 23/50 327/356 |

* cited by examiner

*Primary Examiner* — Jean B Jeanglaude
(74) *Attorney, Agent, or Firm* — Howard IP Law Group

(57) ABSTRACT

A radio frequency receiver includes a first and second analog to digital converter (ADC) connected in parallel. Each ADC is coupled to a corresponding mixer that receives a local oscillator (LO) frequency signal and an analog input signal. Each LO down-converts the analog input signal to a band of frequencies falling within the band of operation of the LO's corresponding ADC. The frequency is selected such that each LO down-converts the input signal such that a portion of the operating band of each LO overlaps. For frequencies falling within the overlapped region, each ADC samples the overlapped frequency band and the corresponding outputs of the parallel ADCs are coherently summed to provide an output having up to about 3 dB improvement in SNR. For sampled frequencies outside the overlapped frequency range, a single corresponding ADC samples the signal which is down coverted and equalized to generate a direct output to expand the instantaneous bandwidth of the receiver.

19 Claims, 7 Drawing Sheets

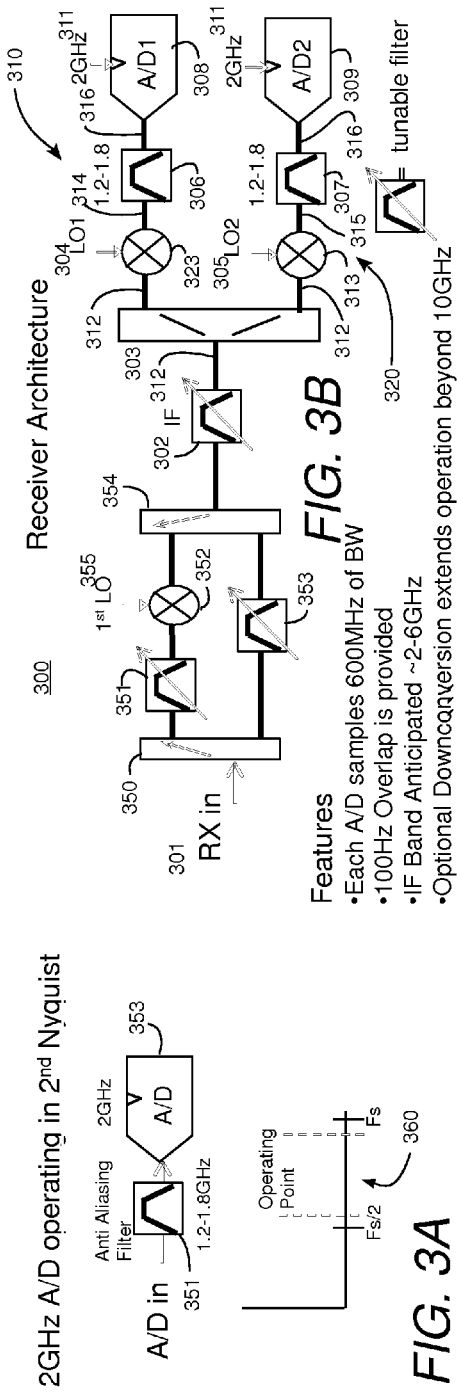

RADIO FREQUENCY RECEIVER WITH OVERLAPPED ANALOG TO DIGITAL CONVERTER (ADC) ARCHITECTURE

FIELD OF THE INVENTION

This application relates to analog to digital converters (ADCs). More particularly, this application relates to ADCs used in a receiver architecture.

BACKGROUND OF THE INVENTION

Radio frequency (RF) receivers, such as receivers used in radar systems, process analog RF input signals using one or more analog to digital converters (ADCs) that sample the analog input and convert the analog input signal into a digital signal for further processing. It is desirable for an RF receiver to have a high dynamic range corresponding to a band of frequencies within the receiver's band of operation. Additionally, it is desirable that the receiver have wide bandwidth, that is, the ability to receive and process signals transmitted across a wide range of frequencies. In receiver design, the desire for increased dynamic range and wideband operation creates tradeoffs where the designer must choose from design options which increase one of dynamic range and wide bandwidth at the expense of the other.

One architecture which has been developed to increase narrowband dynamic range is the provision of dual ADCs. In one example of a dual ADC architecture, the outputs of the dual ADCs outputs are summed to increase the signal to noise ratio (SNR) for the operating band of the receiver. When using summed ADCs, two ADCs sample the analog input signal. The input signal is mixed down using a common local oscillator (LO) associated with both ADCs, which samples the input signal produced by the common LO. The output signals of the ADCs are synchronized by virtue of the common LO and therefore can be directly summed to provide up to an increase in SNR of about 3 dB.

A second architecture uses interleaved ADCs. Interleaved ADCs use interleaved clock signals which are used to increase the effective sampling rate of the receiver using multiple ADCs with each ADC receiving a delayed clock signal relative to other ADCs. For example, in a receiver where the clock signal is delayed and interleaved with the original clock signal, the effective sampling rate may be increased by a factor of two for each clock signal.

IQ processing involving a Quadrature Demodulation may be used, however IQ processing raises concerns regarding images, LO and direct current (DC) leakage.

Stacked ADCs use a number of ADCs operating at different receiver gains to compensate for increased power levels of return signals reflected off of objects located nearer to the receiver relative to other objects. Gain levels may vary within the receiver time window, creating a form of sensitivity time control (STC).

Complex ADCs (CADCs) have been developed, which operate like an interleaved ADC where complex weighting is used during the summing of the ADC outputs. However, interleaving spurs and calibration issues create problems which must be addressed.

In addition to architectures using dual or multiple ADCs, parallel receivers have also been developed where separate parallel receivers each process a portion of the receiver bandwidth. The outputs of each parallel receiver are combined to define the bandwidth of the overall receiver. However, because each ADC is processing a different band of frequencies, the ability to increase the dynamic range of a parallel receiver is limited.

Methods and architectures which provide improved dynamic range and wideband operation are desired.

SUMMARY

There is disclosed an overlapped ADC architecture comprising a hybrid of summed ADCs and parallel receivers. The summed ADCs and parallel receivers operate in conjunction with select LO frequencies and ADC clocking frequencies to perform spectral shifting and digital data alignment that increases dynamic range and allows for wideband operation.

In one embodiment, a RF receiver includes a first ADC and a second ADC. The first and second ADCs are associated with a first LO and a second LO, respectively. A received input signal is applied to first and second mixers coupled to the first and second LOs, respectively, which down-convert the input signal to an intermediate frequency band within the band of operation of the associated ADC. The first and second LOs operate at selected frequencies which are mixed with the input signal such that the down-converted input signal generated includes a band of overlapping frequencies. The overlapping band of frequencies is sampled by the first and second ADCs. The outputs of the first and second ADCs are summed for frequencies falling within the overlapping band of frequencies to provide increased dynamic range for the band of overlapping frequencies. Down-converted frequencies that are within the band of operation of one of the first and second ADCs, but which fall outside the band of overlapping frequencies, are also sampled by the corresponding ADC; and the output of the corresponding ADC is provided as part of the receiver output to expand the instantaneous bandwidth of the receiver.

In an embodiment, a method for converting an analog input signal to a digital output in an RF receiver includes receiving an analog input signal and applying the analog input signal along two parallel paths via a splitter, mixing the input signal with a first frequency of a first LO along the first path, and mixing the input signal with a second frequency of a second LO along the second path. The mixing of the input signals with the first LO signal and second LO signal down-converts the input signal to bands of frequencies that correspond to a band of operation of a first ADC on the first path and a second ADC on the second path. The operation bands of the first and second ADCs are a function of the clock frequency of a common ADC clock applied to each of the first ADC and the second ADC. The down-converted signals generated by the mixing operations include an overlapping band of frequencies, which after down-conversion, are sampled by the first ADC and the second ADC. For frequencies within the overlapping band of frequencies, outputs of the first ADC and second ADC are summed to generate a receiver output that improves the dynamic range of the receiver output at the overlapping input frequencies. For frequencies within the operation band of the first ADC, and which fall outside the overlapping band of frequencies the output of the first ADC is provided as a direct output of the receiver to provide extended frequency channels of the first ADC. Similarly, for frequencies within the operating band of the second ADC, and which fall outside the overlapping band of frequencies, the output of the second ADC is provided as a direct output of the receiver to provide extended frequency channels of the second ADC. These additional frequencies located outside the overlapping band of frequencies expand the instantaneous bandwidth of the receiver. Thus, the receiver output signals, namely, the summed outputs corresponding to the overlapping band of frequencies; and the direct outputs of 1) the first ADC, and 2) the second ADC, after down conversion and equalization, each corresponding to their respective non-overlapping frequencies, provide an overall receiver output which exhibits improved dynamic range for the overlapping ranges, while providing increased bandwidth for non-overlapping ranges.

A radio frequency (RF) receiver comprises a first analog to digital converter (ADC) configured along a first signal path; a second ADC configured on a second signal path parallel to the first signal path, where each ADC is driven by a common clock. A first mixer is disposed upstream to the first ADC on the first signal path and configured to mix a first frequency from a first LO with an intermediate frequency (IF) signal to down-convert the IF signal to a first sampling frequency band. A second mixer is disposed upstream to the second ADC on the second signal path and configured to mix a second frequency from a second LO with the IF signal to down-convert the IF signal to a second sampling frequency band. The first and second LO frequencies are greater than the ADC common clock frequency and selected in accordance with the IF signal frequency bands such that an overlapping band of frequencies of the IF signal fall within the first sampling frequency band and within the second sampling frequency band when the IF signals on the parallel signal paths are down-converted by the first and second LO frequencies. Each of the first ADC and the second ADC is configured to sample the overlapping band of frequencies. The outputs from the first ADC and the second ADC are coherently summed to produce a summed receiver output for the overlapping band of frequencies.

In an embodiment, the RF receiver may further include an input circuit comprising a tunable filter configured to receive an RF analog input signal and output a selectable input frequency band; and a mixer coupled to the output of the tunable filter and to an output of another LO and configured to mix the selectable input frequency band and down-convert the selectable input frequency band to an intermediate frequency band.

In an embodiment, an operating band of the first ADC and an operating band of the second ADC may be narrower than an instantaneous bandwidth of the RF receiver. A splitter may be configured upstream of the first and second mixers for conveying the IF signal to the first and second mixers along the first and second parallel paths.

The RF receiver may further include a summing circuit responsive to the outputs of the first and second ADCs for coherently combining the first and second ADC outputs for sampled frequencies falling within the overlapping band of frequencies.

The RF receiver may further comprise: a first down-converter coupled to the output of the first ADC; a second down-converter coupled to the output of the second ADC; where the first and second down-converters are configured to down-convert output signals from the first and second ADCs to baseband; a first equalizer coupled to the output of the first down-converter; a second equalizer coupled to the output of the second down-converter; and a summing circuit coupled to the output of each the equalizer for coherently combining the outputs of the first and second ADCs to produce the RF receiver output for sampled frequencies falling within the overlapping band of frequencies.

In a receiver a method comprising: receiving an intermediate frequency (IF) input signal along two parallel signal paths; down-converting the IF input signal on the first of the two parallel signal paths to a first sampling frequency band of operation of a first analog to digital converter (ADC) by mixing with a first frequency from a first local oscillator (LO) associated with the first ADC on the first path; down-converting the IF input signal on the second of the two parallel signal paths to a second sampling frequency band of operation of a second analog to digital converter (ADC) by mixing with a second frequency from a second LO associated with the second ADC on the second path, wherein the first frequency band of operation includes a band of frequencies that overlap the second frequency band of operation; sampling the first frequency band of operation using the first ADC to produce a first digital output signal; sampling the second frequency band of operation using the second ADC to produce a second digital output signal, the first ADC and second ADC having a common ADC clock signal having a frequency less than the LO1 and LO2 frequencies; processing the first and second digital output signals, including coherently summing the digital output signal of the first ADC and the digital output signal of the second ADC for frequencies that fall within the overlapping band of frequencies, to generate a combined output signal from the receiver having enhanced signal to noise ratio.

In an embodiment, the receiving an analog IF input signal along two parallel signal paths includes receiving a first RF input signal; band pass filtering the first RF input signal; and splitting the band pass filtered RF input signal via a splitter to generate the analog IF input signal received along two parallel signal paths.

In an embodiment, processing the first and second digital output signals further comprises: down-converting the digital output signals of the first and second ADCs to baseband signals; and conditioning the baseband signals in an equalizer; prior to the coherent summing step.

In an embodiment, after the conditioning step, the method includes directly outputting from the receiver a first output signal representing extended frequency channels for non-overlapping frequencies that fall within the operating of the first ADC; directly outputting from the receiver a second output signal representing extended frequency channels for non-overlapping frequencies that fall within the operating of the second ADC.

BRIEF DESCRIPTION OF THE DRAWINGS

FIG. 3A is a block diagram of a dual ADC receiver for processing of a 1 GHz instantaneous bandwidth according to an embodiment of the disclosure.

FIG. 3B is a frequency plot corresponding to processing a of received radio frequency signal using the receiver illustrated in FIG. 3A.

FIG. 3C shows an anti-aliasing filter and an ADC of FIG. 3A and accompanying frequency plot illustrating the operating range for sampling an incoming signal according to an embodiment of the present invention.

DETAILED DESCRIPTION

Figure 1A:
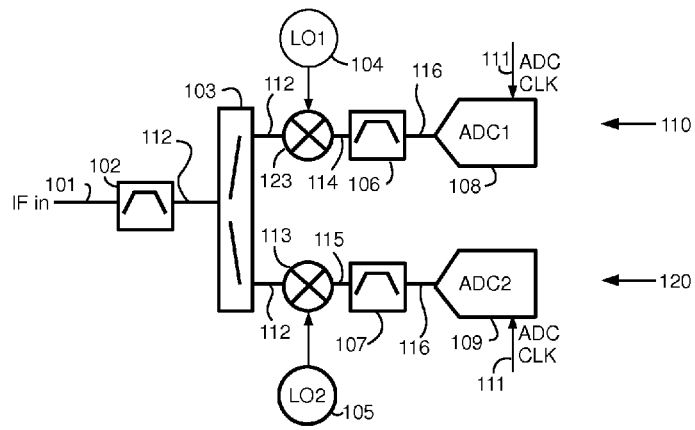
FIG. 1A is a block diagram of a receiver architecture which may be utilized in accordance with an embodiment of the disclosure.

The receiver architecture illustrated in FIG. 1A illustrates an overlapped dual ADC architecture configured as a hybrid of summed ADCs and parallel receivers. The system processes received IF signals utilizing IF filtering, signal path division, LO mixing, and ADC summation of channels at frequencies in the band center for increased dynamic range while extending the instantaneous bandwidth at the band edges. A pair of local oscillators, each associated with a corresponding ADC, are configured to generate a select LO frequency for mixing with a filtered IF signal. Improvements in signal SNR may be achieved through summing of the ADC outputs in a range of overlapping frequencies that are between the down-converted frequency bands produced by the first and the second LO frequencies.

In summed ADCs, data from a single analog input is fed via symmetrical input networks to two parallel ADCs. Each parallel ADC samples the analog input simultaneously. Because the samples from each ADC are collected simultaneously, the two ADC channels align in the digital domain. The two parallel signals may then be processed using digital signal processing (DSP) techniques. For example, the outputs of the two ADC channels may be summed in the digital domain on a sample by sample (e.g. point for point) basis. The summed signals may be processed to provide up to a 3 dB improvement in ADC SNR. Coherent signals (e.g. signals with the same phase, frequency and amplitude) sum in terms of voltage. Random signals, such as noise, which are phase, frequency and amplitude independent, sum in terms of power. A signal of interest may be increased by up to about 6 dB after summation, while the noise may only increase by about 3 dB, resulting in a net increase in ADC SNR of 3 dB.

In parallel receiver architectures, separate receivers each receive an analog input signal. Each receiver filters the input signal at a particular bandwidth associated with that receiver. The filtered signal is sampled and converted to a digital output for the selected bandwidth. The output of the parallel receivers across each receiver bandwidth may then be combined to provide a wider instantaneous bandwidth than any one of the individual parallel receivers alone.

FIG. 1A is a block diagram of a receiver architecture which may be utilized in accordance with an embodiment of the disclosure. The receiver architecture illustrated in FIG. 1A depicts an overlapped ADC architecture that combines features of a summed ADC architecture with features of a parallel receiver architecture. Frequency selection and tuning of the local oscillators (LOs) associated with each of a pair of ADCs in a dual ADC architecture is made to achieve select frequencies in connection with one or more frequency bands of interest. Improvements in signal SNR may be achieved by summing the outputs of the dual ADCs for a range of frequencies which overlap. Overlapping frequencies are those frequencies which down-convert from the IF signal via two local oscillators operating at different frequencies into the operating band of each of the respective dual ADCs. In other words, after the received signal is mixed down to the operating band of each ADC, frequencies from the IF signal which fall into the operating bands of the first ADC and the second ADC are considered to be overlapping. Since both ADCs of the dual ADC architecture are sampling these frequencies, the outputs of the dual ADCs for these overlapping frequencies may be added together to generate an output signal for the receiver at the overlapping frequencies that include improvements in dynamic response (e.g. SNR). Furthermore, each ADC of the dual ADC receiver also samples a portion of the IF input signal at frequencies outside the overlapped frequency band. These sampled frequencies are processed by each ADC individually and may be output by the receiver to provide additional bandwidth. The block diagram of FIG. 1A shows a receiver which may be configured to provide the above advantages.

Still referring to FIG. 1A, a radio frequency (RF) signal is received and/or mixed down to an intermediate frequency (IF) band signal 101. The IF band signal 101 is filtered in band pass filter 102 to produce a filtered input signal 112. The filtered input signal 112 is divided via splitter 103 such that filtered input signal 112 is applied to two parallel processing paths 110 and 120.

Figure 1B:
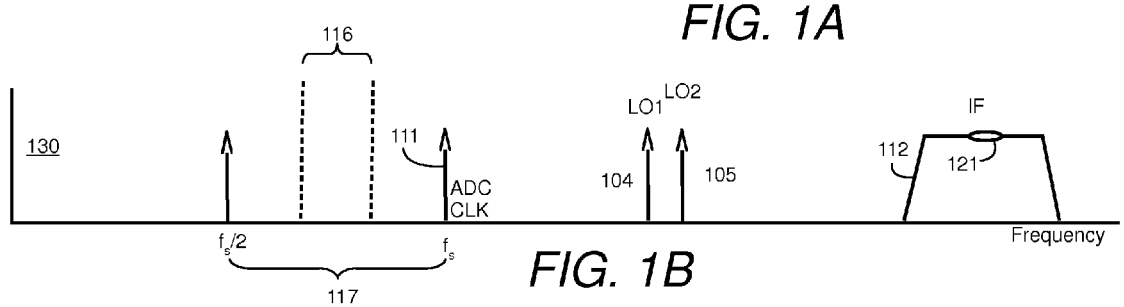
FIG. 1B, FIG. 1C and FIG. 1D show frequency plots corresponding to processing a received radio frequency signal by a receiver such as that illustrated in FIG. 1A according to an embodiment of the disclosure.

In the first processing path 110, the filtered input signal 112 is input to mixer 123 along with the output of a first local oscillator (LO1) 104 at a predetermined frequency (FIG. 1B). The mixer 123 receives the filtered input signal 112 and the local oscillator 104 signal and multiplies the inputs to provide an output that is the sum or the difference of the filtered input signal 112 and LO1 104. The filtered input signal 112 is down-converted by LO1 104 to a first down-converted signal 114, which is further filtered by anti-aliasing filter 106 to produce filtered down-converted signal 116. The filtered down-converted signal 116 is then sampled by a first ADC (ADC1) 108. ADC1 108 is driven by a common ADC clock 111.

In the second processing path 120, the filtered input signal 112 is input to mixer 113 along with the output of a second local oscillator (LO2) 105 at a predetermined or select frequency (FIG. 1B). The mixer 113 receives the filtered input signal 112 and the local oscillator 105 signal and multiplies the inputs to provide an output that is the sum or the difference of the filtered input signal 112 and LO2 105. The filtered input signal 112 is down-converted by LO2 105 to a second down-converted signal 115, which is further filtered by anti-aliasing filter 107 to produce the filtered down-converted signal 116 having the same band of frequencies as the output of anti-aliasing filter 106 of first processing path 110. The filtered down-converted signal 116 is sampled by a second ADC (ADC2) 109. ADC2 109 is driven by common ADC clock 111.

Figure 1C:
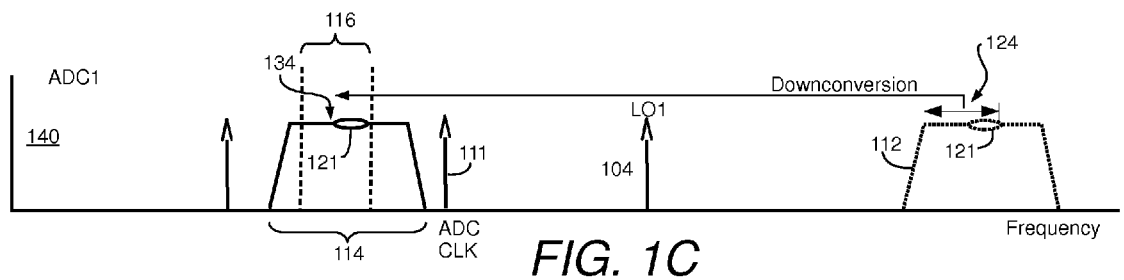
Figure 1D:
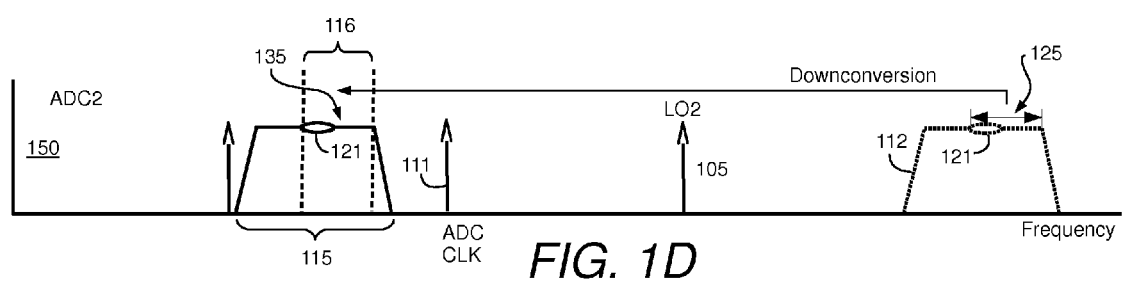

Referring now to FIG. 1B, FIG. 1C and FIG. 1D with reference to FIG. 1A, there are shown three frequency plots, 130, 140, 150. Each of the three frequency plots 130, 140, 150 represents the same range of frequencies along the horizontal axis. Thus, frequency plots 130, 140 and 150 may alternatively be viewed as superimposed on one another as viewed during operation of the receiver architecture illustrated in FIG. 1A.

Plot 130 shows relative frequency values and ranges between filtered input signal 112, the output frequency of LO1 104, the output frequency of LO2 105, the frequency of ADC common clock 111, and the bandwidth of filtered down-converted signal 116 along each of the parallel processing paths. Note that the down-converted signal along one signal path contains the low end frequencies of the filtered input signal while the down-converted signal along the other signal path contains the high end frequencies. The ADC clock 111 frequency defines Nyquist zones in which ADC1 108 and ADC2 109 sample the down-converted input signals. For example, each ADC 108, 109 uses a common ADC clock 111 to sample the input at a sampling frequency $f_s$. The second Nyquist zone 117 is defined as frequencies $f_s/2$ through $f_s$ as shown in plot 130 of FIG. 1B. The anti-aliasing filter 106 and anti-aliasing filter 107 (FIG. 1A) filter the down-converted signals 114 and 115, respectively to the filtered down-converted frequency range 116 which falls within the second Nyquist zone 117.

Frequencies within the filtered input signal 112 include a sub-range of frequencies 121, which are considered to be overlapping frequencies. Overlapping frequencies refer to frequencies within the range of filtered input signal 112 that when down-converted by LO1 104 and LO2 105, respectively, fall within the range or band of frequencies that pass through the anti-aliasing filter 106 associated with ADC1 108 and the anti-aliasing filter 107 associated with ADC2 109. The overlapping frequencies 121 are located within the filtered down-converted frequency band 116 (FIGS. 1B, 1C, 1D). Both ADC1 108 and ADC2 109 sample the down-converted overlapping range of frequencies 121. Therefore, the outputs of ADC1 108 and ADC2 109 may be coherently summed in the receiver output to produce an output signal having an enhanced SNR.

Referring to frequency plot 140, the operation of ADC1 108 is illustrated with regard to frequencies processed by first processing path 110 shown in FIG. 1A. The filtered input signal defines a range of IF frequencies 112. The IF frequency range 112 includes a subset of overlapping frequencies 121. The filtered input signal 112 is combined with LO1 104 by mixer 123 to down-convert the IF signal to down-converted input signal 114. Frequencies within the down-converted input signal 114 are filtered to produce a range of frequencies within a selected Nyquist Zone as defined by ADC clock 111. Within the selected Nyquist zone, ADC1 108 can effectively sample the filtered down-converted signal 116. While frequency plot 140 illustrates use of the second Nyquist zone, other Nyquist zones associated with ADC clock frequency 111 may be used. A portion of the IF frequencies of filtered input signal 112, denoted as 124 in plot 140, include the range of overlapping frequencies 121 as well as other frequencies falling below the range of overlapping frequencies 121. The portion of IF frequencies 124 are down-converted via LO1 104 to down-converted range 134 which falls within the anti-aliasing filtered down-converted frequency range 116.

Referring to frequency plot 150, the operation of ADC2 109 is illustrated with regard to frequencies processed by second processing path 120 of FIG. 1A. The filtered input signal defines a range of IF frequencies 112. The IF frequency range 112 includes a subset of overlapping frequencies 121. The filtered input signal 112 is combined with LO2 105 by mixer 113 to down-convert the IF signal to down-converted input signal 115. Frequencies within the down-converted input signal 115 are filtered to produce a range of frequencies within a selected Nyquist zone defined by the ADC clock. Within the selected Nyquist zone, ADC2 109 can effectively sample the filtered down-converted signal 116. While frequency plot 150 illustrates use of the second Nyquist zone, other Nyquist zones associated with ADC clock frequency 111 may be used. A portion of the IF frequencies of filtered input signal 112, denoted as 125 in plot 150, include the range of overlapping frequencies 121 as well as other frequencies falling outside (e.g. above) the range of overlapping frequencies 121. The portion of IF frequencies 125 are down-converted via LO1 104 to down-converted range 135 which falls within the anti-aliasing filtered down-converted frequency range 116.

Processing of the down-converted filtered signals 116 by dual ADCs 108, 109 will now be described with reference to plots 130, 140 and 150 of the drawings. ADC1 108 samples frequencies within the anti-aliasing filtered signal range 116. The frequencies sampled by ADC1 108 represent down-converted frequencies corresponding to the range of overlapping frequencies 121, and the lower end frequencies of IF frequency band 112, denoted together as range 124. Accordingly, ADC1 108 will sample the down-converted input signal denoted as range 134, which includes down-converted overlapping frequencies 121.

ADC2 109 samples frequencies falling within anti-aliasing filtered signal 116. The frequencies sampled by ADC2 109 are down-converted frequencies corresponding to the range of overlapping frequencies 121 and the upper end frequencies of IF frequency band 112, denoted together as range 125. Accordingly, ADC2 109 will sample the down-converted input signal denotes as range 135, which includes down-converted overlapping frequencies 121.

The overlapping frequency range 121 down-converts via LO1 104 and LO2 105 to the filtered sampling range (e.g. 116) of both ADC1 108 and ADC2 109. Therefore, the outputs of ADC1 108 and ADC2 109 include output values corresponding to these overlapping frequencies 121. For the overlapping frequencies 121 of filtered input signal 112 which are sampled by ADC1 108 and by ADC2 109, the corresponding outputs of the dual ADCs 108, 109 may be summed to produce an output of the receiver which exhibits higher SNR. In addition, the lower end frequencies of IF range 112 which are down-converted by LO1 104 to frequency range 134 of plot 140, are sampled by ADC1 108. Similarly, the higher end frequencies of IF range 112, which are down-converted by LO2 105 to frequency range 135 of plot 150, are sampled by ADC2 109. Accordingly, in addition to the improved SNR signal achieved through dual sampling of overlapping frequency band 121, non-overlapping frequencies in band 134 are sampled by ADC1 108 and may be provided as a direct output of the receiver, thereby providing extended receiver bandwidth. Likewise, non-overlapping frequencies in band 135 are sampled by ADC2 109 and provided as direct output of the receiver providing extended receiver bandwidth. The resulting receiver output provides an improved SNR output for selected portions of the receiver bandwidth corresponding to the range of overlapping frequencies as well as extended bandwidth provided by the non-overlapped frequencies sampled singly by one of ADC1 108 and ADC2 109. In the example illustrated in FIG. 1B, ADC1 108 provides extended bandwidth for frequencies within IF range 112 that fall outside (e.g. below) the overlapping band of frequencies 121 while ADC2 109 provides extended bandwidth for frequencies with IF range 112 that fall above the overlapping band of frequencies 121.

Figure 1E:
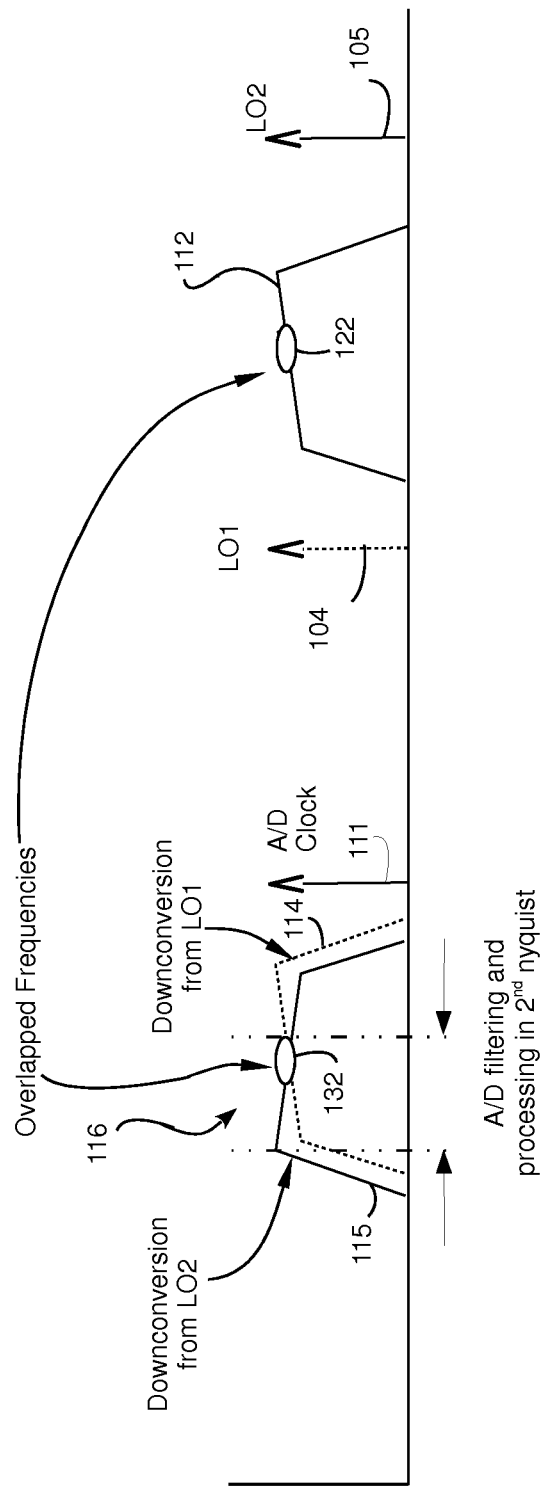
FIG. 1E is a frequency plot corresponding to processing a receiver radio frequency signal by a receiver such as that illustrated in FIG. 1A according to another embodiment of the disclosure.

FIG. 1E with reference to FIG. 1A, shows a frequency plot illustrating the operation of a receiver architecture according to an embodiment of the disclosure which may be implemented using the receiver architecture of FIG. 1A. A filtered input signal produces frequencies within an IF filtered input frequency band 112. A subset of frequencies define a range of overlapping frequencies 122 associated with the two parallel paths. LO1 104 produces a frequency that falls below the IF filtered input frequency band 112, while LO2 105 produces a frequency that is above the IF filtered input frequency band 112. The frequency signal of LO1 104 is mixed in mixer 123 with the filtered input signal 112 to down-convert the IF filtered input signal band 112 to first down-converted frequency band 114. The frequency signal of LO2 105 is mixed in mixer 113 with the filtered input signal 112 to down-convert the IF filtered input signal band 112 to second down-converted frequency band 115. Second down-converted frequency band 115 is inverted with respect to IF filtered input signal band 112 due to the frequency of LO2 105 being greater than the frequencies in the IF filtered input signal band 112.

The down-converted frequency bands 114, 115 are filtered using anti-aliasing filters 106, 107 respectively, to produce a filtered down-converted frequency band 116 which corresponds to the operating band of ADC1 108 and ADC2 109. The range of frequencies 122 are down-converted to down-converted overlapping frequency range 132, which fall within the operating range of both ADC1 108 and ADC2 109. The output signals from ADC1 108 and ADC2 109 produced by sampling frequencies within the down-converted overlapping frequency band 132 may be summed to produce an output signal of the receiver with improved SNR for the overlapping frequencies 132. The lower end frequencies containing non-overlapping frequencies of down-converted frequency band 114 associated with LO1 404, are sampled by ADC1 108. The output of ADC1 108 is output to produce extended bandwidth below the range of down-converted overlapping frequencies 132. Similarly, the higher end frequencies containing non-overlapping frequencies of down-converted frequency band 115 associated with LO2 405 are sampled by ADC2 109. The output of ADC2 109 is output from the receiver to produce extended bandwidth above the range of down-converted overlapping frequencies 132.

Figure 2A:
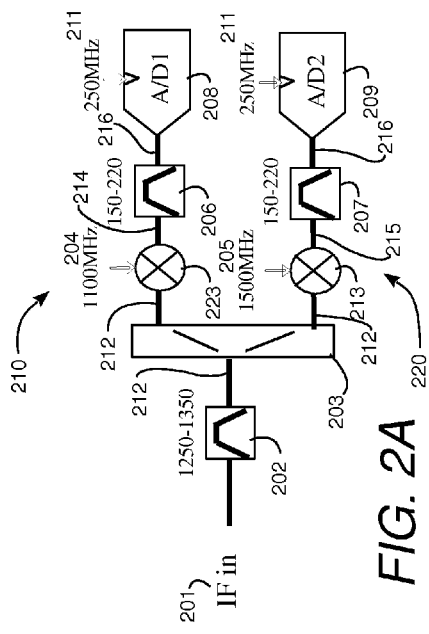
FIG. 2A is a block diagram of a dual ADC receiver for processing of a 100 MHz instantaneous bandwidth according to an embodiment of the disclosure.
Figure 2B:
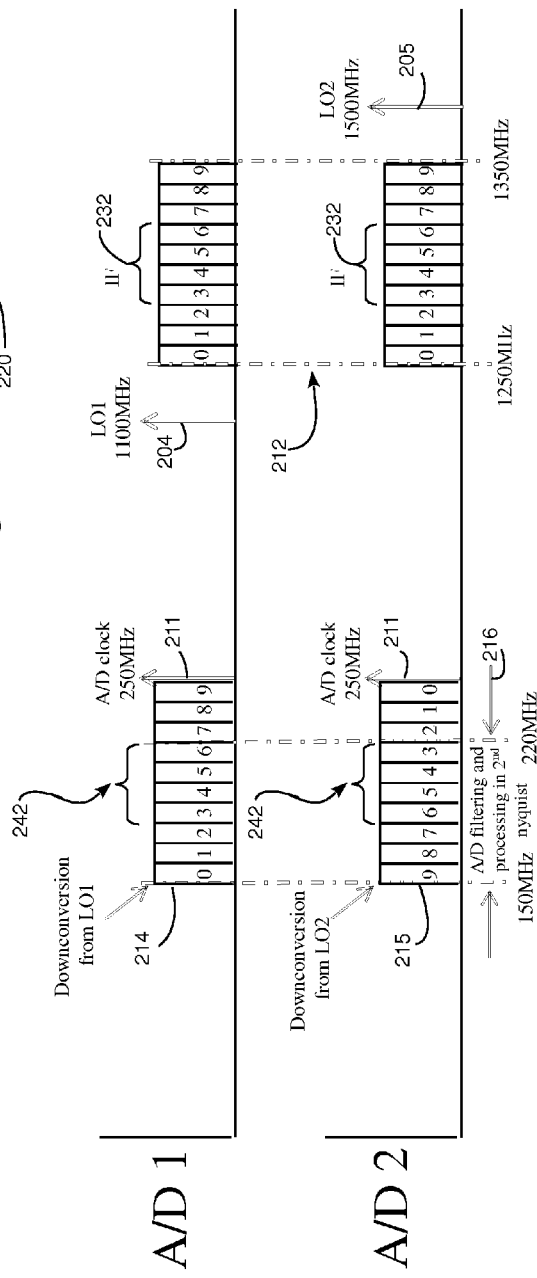
FIG. 2B is a frequency plot corresponding to processing of a received radio frequency signal using the receiver illustrated in FIG. 2A.

FIG. 2A is a block diagram of a hybrid receiver architecture according to an embodiment of the disclosure. FIG. 2B shows a frequency plot for the hybrid receiver architecture shown in FIG. 2A according to an embodiment of the disclosure. The receiver architecture of FIG. 2A is provided by way of non-limiting example, and illustrates a receiver using dual 250 MHz (e.g. clock signal 211) ADCs 208, 209 and an IF frequency band of 100 MHz (e.g. 1250 MHz-1350 MHz). In the receiver of FIG. 2A, an analog input signal 201 is received and filtered to a frequency band between 1250 MHz and 1350 MHz by band pass filter 202 to define an IF frequency band of filtered input signal 212. IF frequency band 212 includes a range of overlapping frequencies 232 (FIG. 2B), which are down-converted, sampled, and processed by ADCs 208, 209. This is accomplished by the filtered input signal 212 being split by divider or splitter 203 and processed along symmetrical parallel processing signal paths 210, 220. The first processing path 210 is defined by LO1 204 which synthesizes a frequency at 1100 MHz. The signal from LO1 204 is mixed with the filtered input signal 212 by mixer 223. Band pass filter 206 determines the operating band 216 of ADC1 208 which falls between 150 MHz and 220 MHz. The frequency provided by LO1 204 is lower than IF frequency band of filtered input signal 212. The second processing path 220 is defined by LO2 205 which synthesizes a frequency at 1500 MHz. The signal from LO2 205 is mixed with the filtered input signal 212 by mixer 213. Band pass filter 207 determines the operating band of ADC2 209, which falls between 150 MHz and 220 MHz. The frequency provided by LO2 205 is higher than IF frequency band of filtered input signal 212. The receiver of FIG. 2A therefore provides a low end LO1 204, and a high end LO2 205, similar to that illustrated by the frequency plot of FIG. 2B.

The 100 MHz IF frequency band 212 is shown in FIG. 2B by way of non-limiting example, as divided into 10 channels of 10 MHz each numbered 0 through 9. LO1 204 down-converts the IF frequency band 212 to ADC1 208 operating band 216, which includes down-converted overlapping frequencies 242. LO2 205 down-converts and inverts the IF frequency band 212 to ADC2 209 operating band 216, which includes down-converted overlapping frequencies 242. Considering the operating band of ADC1 208, corresponding to the first processing path 210, down-converted channels 0 through 6 fall within the operating band 214 of ADC1 208. The operating band of ADC2 209 associated with the second processing path 220, is down-converted and inverted with channels 9 through 3 falling within the operating band 215 of ADC2 209. Accordingly, channels 3 through 6 define overlapped frequency bands 242 in that these frequencies fall within the operating band of both ADC1 208 and ADC2 209. As a result of the overlapping frequency ranges 242, the outputs of ADC1 208 and ADC2 209 corresponding to channels 3-6 may be summed to provide about a 3 dB improvement in SNR and dynamic range. Additionally, to further increase the instantaneous bandwidth of the receiver, the first and second processing paths 210, 220 may act as parallel receivers, in that channels 0-2 are processed by ADC1 208 associated with the first processing path 210, while channels 7 through 9 are processed by ADC2 209 associated with the second processing path 220.

Thus, the receiver architecture depicted in FIG. 2A, 2B acts as a hybrid dual ADC receiver, providing improved dynamic range for overlapping channels 3-6, while at the same time extending the receiver bandwidth to include channels 0-2 and 7-9 in a manner consistent with parallel receivers. As may be seen in FIG. 2B, for a 250 MHz dual ADC architecture, the practical operating band of 70 MHz (150 MHz-220 MHz) may be utilized to receive the entire 100 MHz IF band, while providing the benefit of increased narrowband dynamic range for channels 3 through 6. While channels 0-2 and 7-9 do not experience the improvement in dynamic range provided by summing the ADC outputs, the receiver of FIG. 2A provides additional bandwidth range utilizing dual summed ADCs each having an independent LO frequency.

FIG. 3A is a block diagram illustrating the effective operating range of a 2 GHz ADC 353. An analog input is passed through an antialiasing filter 351 which passes a 0.6 GHz operating band between 1.2 GHz and 1.8 GHz. The operating range 360 of the ADC 353 is selected to be in the $2^{nd}$ Nyquist zone between $f_s/2$ and $f_s$ (e.g. within the range of 1 GHz to 2 GHz). For a commercial off-the-shelf (COTS) ADC 353 designed to operate at 2 GHz, the operating point or band 360 of the ADC 353 may be limited to about 50% to about 60% of the Nyquist zone. Band pass filter 351 provides anti-aliasing at frequencies between 1.2 GHz and 1.8 GHz (e.g. 600 MHz). The architecture of receiver 300 provides a wideband 1 GHz Instantaneous bandwidth receiver using dual 2 GHz COTS ADCs according to an embodiment of the disclosure. Referring now to FIG. 3B with reference to the frequency plot in FIG. 3C, a receiver architecture is shown according to an embodiment of the disclosure. An analog receiver input signal 301 is received and passed to a switch 350. The RF input signal 301 is directed through switches 350 and 354 along one of two input paths. The first path is via filter 351 to mixer 352 which also receives an input frequency signal from LO 355 to produce a down-converted IF band signal. In the second path configurable with switches 350, 354, the RF input signal 301 is applied directly via tunable filter 353. Filter 302 receives and IF filters the signal to provide a filtered input signal 312 to symmetrical parallel signal paths 310, 320. This optional down-conversion (e.g. path one, including LO 355) of the RF input signal 301 allows for operation at or beyond 10 GHz, shown by the operating band 331 in FIG. 3C. Optionally, at the receiver input, LO 355 may be operated at a frequency to down-convert the operating band 332 to an IF band 312 having a bandwidth from about 2 GHz to about 6 GHz.

The first processing path 310 of receiver 300 includes local oscillator 304 which inputs a frequency signal to mixer 323 along with filtered input signal 312. Filter 306 defines the operating range of 1.2 GHz to 1.8 GHz, corresponding to ADC1 308. The second processing path 320 of receiver 300 includes local oscillator 305 which inputs a frequency signal to mixer 313 along with filtered input signal 312. Filter 307 defines the operating range of 1.2 GHz to 1.8 GHz corresponding to ADC2 309. ADC1 308 and ADC2 309 receive a common ADC clock signal 311 at about 2 GHz. As shown in FIG. 3C, LO1 304 operates at a frequency 404 that is about 1.2 GHz below the lower limit of IF band 312. LO2 305 operates at a frequency 305 that is about 1.2 GHz above the upper limit of IF band 312. The IF frequency band 312 is down-converted by LO1 304 to frequency band 314. IF frequency band 312 is down-converted and inverted by LO2 305 to frequency band 315. LO1 304 and LO2 305 are configured to provide about 100 MHz of frequency overlap 336. In the region where the frequencies overlap 336, both ADC1 308 and ADC2 309 sample and process the down-converted input signals 314, 315, respectively. Since both ADCs 308, 309 sample the signal in the 100 MHz region of overlapping frequencies, the outputs of ADC 308 and ADC 309 may be summed at the overlapping frequencies to provide an improvement in SNR and dynamic range. The improvement may result in about 3 dB increase in SNR. Within the 1.2 GHz to 1.8 GHz operating band of ADC1 308 and ADC2 309, respectively, ADC1 308 processes the lower frequencies of IF band 312, while ADC2 309 processes the upper frequencies of IF band 312. In this manner, despite the 600 MHz operating band of ADCs 308 and 309, an instantaneous bandwidth of about 1 GHz may be achieved by receiver 300. An increase in dynamic range is provided by the frequency overlap 336 between ADC1 308 and ADC2 309 due to the selected frequencies of LO1 304 and LO2 305, which allow the outputs of ADCs 308 and 309 to be coherently summed.

Figure 4:
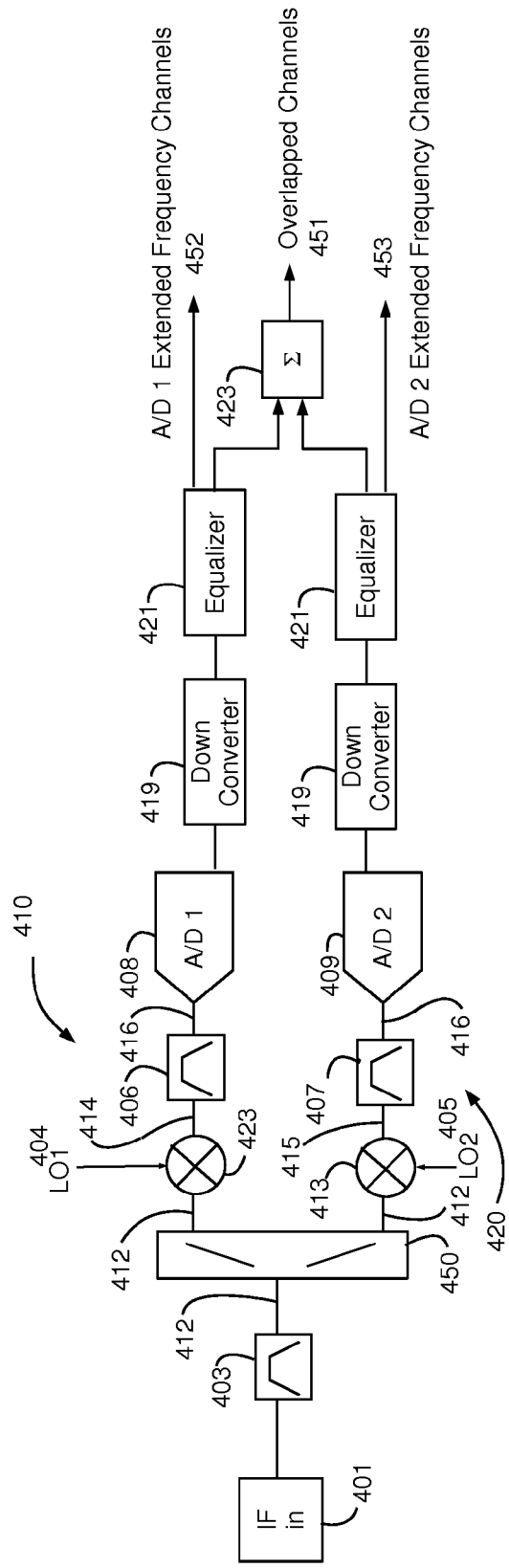
FIG. 4 is block diagram of a dual ADC receiver showing processing functions according to an embodiment of the disclosure.

FIG. 4 is a block diagram of a receiver according to an embodiment of the disclosure including components for performing digital signal processing (DSP) to the converted input signal. An input signal, such as IF signal 401 is received at the receiver and filtered by band pass filter 403. The filtered input signal 412 is split by power divider or splitter 450 and applied to two parallel processing paths 410, 420. First processing path 410 includes a mixer 423 which receives the filtered input signal 412 and the output frequency of a first LO (LO1) 404. LO1 404 down-converts the filtered IF input signal 412 to a first sampling frequency band 414. This signal is filtered by band pass filter 406 to produce the operating frequency band 416 that is sampled by ADC1 408.

Second processing path 420 includes a mixer 413 which receives the filtered input signal 412 and the output frequency of a second LO (LO2) 405, and down-converts the filtered IF input signal 412 to a second sampling frequency band 415. This signal is filtered by band pass filter 407 to produce the operating frequency band 416 that is sampled by ADC2 409.

The output signals from ADC1 408 and ADC2 409 are input to digital down-converters 419 that convert the sampled signals to baseband. The outputs of digital down-converters 419 are input to equalizers 421 for conditioning the baseband signal. Combining circuit 423 receives the conditioned baseband signals from equalizers 421 and coherently combines the output signals from ADC1 408 and ADC2 409. For example, LO1 404 and LO2 405 may operate at selected frequencies that down-convert the IF input signal 412 to sampling frequency bands that contain certain frequencies which overlap between the operating band of ADC1 408 and the operating band of ADC2 409. In the region of overlapping frequencies, the outputs of ADC1 408 and ADC2 409 are summed to produce an output with improved SNR characteristics. In non-overlapping frequencies falling within the operating band of one of either ADC1 408 or ADC2 409, the output of the corresponding ADC is used to expand the bandwidth of the receiver. Combining circuit 423 is configured to sum the outputs of the ADCs 408, 409 for frequencies falling within the overlapping band of frequencies. The receiver outputs 451, 452, 453 represent the summed outputs for the overlapped channels (451), along with the expanded bandwidth frequencies processed by one or the other of ADC1 408 and ADC2 409.

By way of further example, the outputs of ADC1 408 and ADC2 409 are coherently aligned to produce receiver outputs corresponding to the ADC1 408 extended frequency channels 452 corresponding to non-overlapping frequencies sampled by ADC1 408, the ADC2 409 extended frequency channels 453 corresponding to non-overlapping frequencies sampled by ADC2 409 and the summed outputs 451 of ADC1 408 and ADC2 409 corresponding to the outputs of ADC1 408 and ADC2 409 for frequencies in the overlapping frequency band. Receiver outputs 451, 452, 453 may be directed to further downstream processing applications configured to receive outputs of the receiver shown in FIG. 4. By way of non-limiting example, further downstream processing may include radar processors configured to process outputs of the receiver. For example, a tracking radar system may be configured to receive the extended frequency channels output by ADC1 408 and/or ADC2 409 and process the receiver outputs to track detected radar targets. Other radar systems, such as imaging or targeting radar, which may require higher resolution signals, may be configured to receive and process the summed output 451 from ADC1 408 and ADC2 409.

Figure 5:
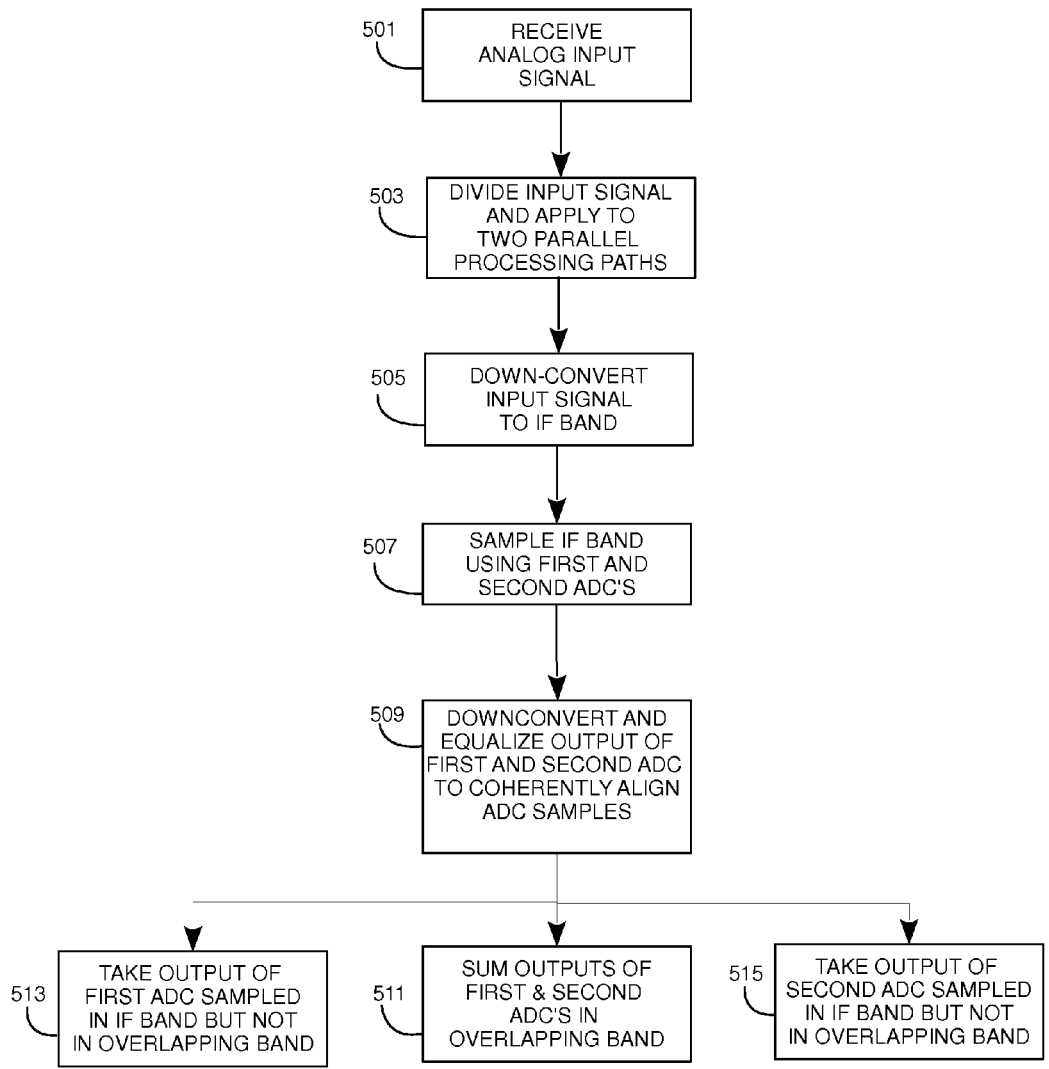
FIG. 5 is a process flow diagram showing a method for converting an analog input signal to a digital output signal in a receiver according to an embodiment of the disclosure.

Referring now to FIG. 5, a process flow diagram of a method for converting an analog input signal to a digital signal according to an embodiment of the disclosure is shown. In a receiver, an analog signal is received 501. The analog input signal may be an RF signal received directly. In another embodiment, the RF signal may be mixed down to an IF signal prior to being received at the receiver. The analog input signal is divided in a power divider or splitter. The split analog input signal is then applied to two parallel processing paths 503. The first parallel processing path includes a first ADC coupled to a first mixer and local oscillator operating at a selected frequency. The second parallel processing path includes a second ADC coupled to a second mixer and LO operating at a second frequency different from the first frequency. The analog input signal is down-converted to an intermediate frequency band 505 via the first and second local oscillators. Each down-converted IF band is then sampled 507 by the respective first and second ADCs. The first LO and the second LO frequencies are selected such that the down-converted frequency band includes an overlapping band of frequencies. The outputs from the first and second ADCs are then down-converted to baseband and conditioned 509, for example via a down-converter/equalizer. For sampled frequencies that fall within the overlapping band of frequencies (e.g. frequencies sampled by both the first ADC and the second ADC), the outputs of the first ADC and the second ADC are coherently summed to provide an improved SNR output in the band of overlapping frequencies 511. The first ADC samples frequencies associated with the down-converted frequency band associated with the first LO. For frequencies sampled by the first ADC that do not fall within the overlapping band of frequencies, the output from the first ADC alone is used to generate an output signal of the receiver which provides additional bandwidth beyond the summed outputs associated with the overlapping band of frequencies 513. Similarly, the second ADC samples frequencies associated with the down-converted frequency band associated with the second LO. For frequencies sampled by the second ADC that do not fall within the overlapping band of frequencies, the output from the second ADC is used to generate an output signal of the receiver which provides additional bandwidth beyond the summed outputs associated with the overlapping band of frequencies 515. The method according to FIG. 5 enables a receiver to provide up to about 3 dB improvement in SNR for frequencies falling within the overlapping band of frequencies sampled by both the first and second ADC, while providing additional instantaneous bandwidth extending beyond the overlapping frequencies, including frequencies that fall outside the overlapping band of frequencies, but are sampled on one of either the first ADC or the second ADC.

The embodiments described hereinabove provide RF receivers having a hybrid architecture. The hybrid architecture provides benefits of summing dual ADCs to increase dynamic range combined with benefits of parallel receivers for expanding receiver bandwidth. Through frequency planning, LO frequencies and ADC clock rates may be chosen such that the input signal is down-converted by each LO to include a band of frequencies that overlap with frequencies generated by the other LO. The ADC outputs are summed for frequencies that fall within the overlapping band of frequencies. Backend digital signal processing provides digital alignment and calibration of the ADC outputs to provide a receiver output signal which benefits from increased dynamic range within the overlapping band of frequencies and expanded bandwidth for frequencies sampled by the parallel ADCs that fall outside the overlapped band of frequencies.

Digital signal processing may be performed through the use of a computer including a processor coupled to a memory. The memory may have stored thereon, computer readable instructions which when executed by the processor, cause the processor to perform control and processing functions of a RF receiver according to embodiments of this disclosure. The processor and memory may be communicatively coupled to other components of the RF receiver architecture for control and processing of the receiver.

Figure 6:
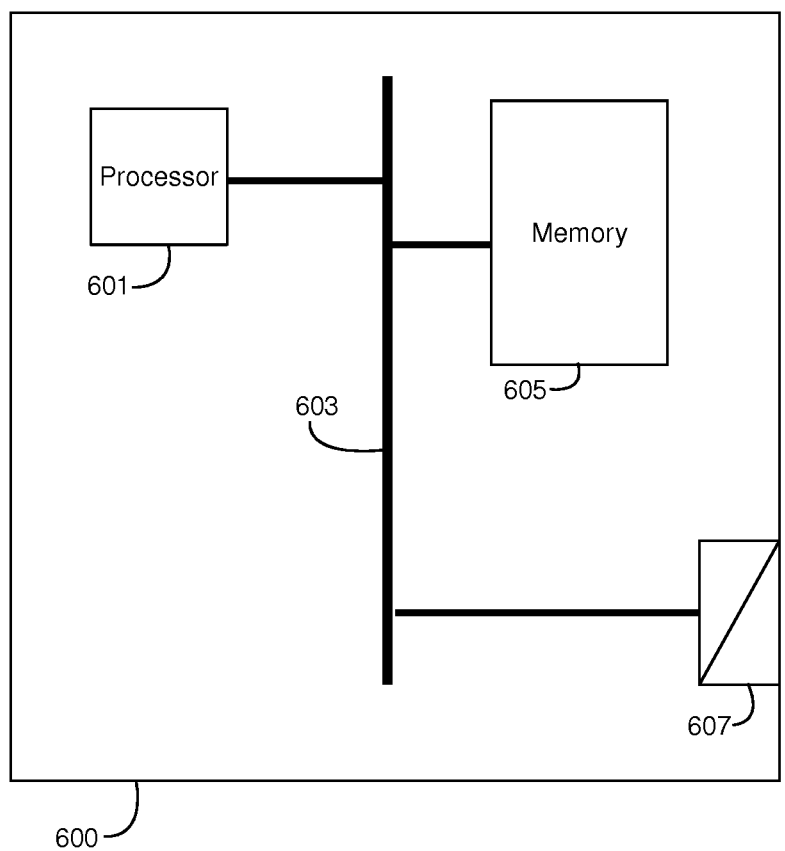
FIG. 6 is a block diagram depicting components of a special purpose computer configured to perform functions of a dual ADC receiver according to an embodiment of the disclosure.

FIG. 6 is a block diagram of a computer which may be configured to perform functions of a hybrid RF receiver in accordance with an embodiment of the disclosure. Computer 600 includes a processor 601. The processor is coupled to a communications bus 603 which facilitates transfer of information between the components of computer 600. A memory 605 is in communication with communications bus 603. The memory 605 may be configured to store computer readable instructions. Computer readable instructions stored in memory 605 may be communicated to processor 601 via communications bus 603. When the computer readable instructions are received by processor 601, processor 601 may execute the instructions to perform the functions associated with a hybrid RF receiver as described hereinabove. Computer 600 may further include a communications port 607 which is coupled to communications bus 603. Communications port 607 allows for attachment of computer 600 to external components. Communications port 607 may receive information or instructions from external components including other computers or computer networks, or alternatively, communications port 607 may output information including instructions or control signals to components or other computers or networks which are external to computer 600.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A radio frequency (RF) receiver comprising:
a first analog to digital converter (ADC) configured along a first signal path;
a second ADC configured on a second signal path parallel to said first signal path, each ADC driven by a common clock;
a first mixer upstream to said first ADC on said first signal path and configured to mix a first frequency from a first LO with an intermediate frequency (IF) signal to down-convert said IF signal to a first sampling frequency band;

a second mixer upstream to said second ADC on said second signal path and configured to mix a second frequency from a second LO with said IF signal to down-convert said IF signal to a second sampling frequency band, said first and second LO frequencies being greater than the ADC common clock frequency and selected in accordance with the IF signal frequency bands such that an overlapping band of frequencies of said IF signal fall within said first sampling frequency band and within said second sampling frequency band when said IF signals on said parallel signal paths are down-converted by said first and second LO frequencies, wherein each of said first ADC and said second ADC is configured to sample said overlapping band of frequencies; and wherein outputs from said first ADC and said second ADC are coherently summed to produce a summed receiver output for said overlapping band of frequencies.

2. The RF receiver of claim 1, wherein said first LO is configured to synthesize a frequency that is lower than a lower limit of said IF signal band.

3. The RF receiver of claim 2, wherein said second LO is configured to synthesize a frequency that is lower than said lower limit of said IF signal band.

4. The RF receiver of claim 2, wherein said second LO is configured to synthesize a frequency that is higher than an upper limit of said IF signal band.

5. The RF receiver of claim 1, further comprising:
an input circuit comprising:
   a tunable filter configured to receive an RF analog input signal and output a selectable input frequency band; and
   a mixer coupled to the output of the tunable filter and to an output of another LO and configured to mix the selectable input frequency band and down-convert the selectable input frequency band to an intermediate frequency band.

6. The RF receiver of claim 1, wherein an operating band of said first ADC and an operating band of said second ADC are narrower than an instantaneous bandwidth of said RF receiver.

7. The RF receiver of claim 1, wherein said first ADC and said second ADCs are configured to operate at a frequency of 2 GHz.

8. The RF receiver of claim 1, further comprising a splitter configured upstream of said first and second mixers for conveying said IF signal to said first and second mixers along said first and second parallel paths.

9. The RF receiver of claim 8, wherein said IF input signal comprises a frequency band of about 2 GHz to about 6 GHz.

10. The RF receiver of claim 9, wherein said first ADC and said second ADC are configured to sample an operating band of about 600 MHz.

11. The RF receiver of claim 10, wherein said first sampling frequency band and said second sampling frequency band overlap over a 100 MHz range of frequencies.

12. The RF receiver of claim 1, further comprising a summing circuit responsive to the outputs of said first and second ADCs for coherently combining said first and second ADC outputs for sampled frequencies falling within said overlapping band of frequencies.

13. A radio frequency (RF) receiver comprising:
a first analog to digital converter (ADC) configured along a first signal path;
a second ADC configured on a second signal path parallel to said first signal path, each ADC driven by a common clock;
a first mixer upstream to said first ADC on said first signal path and configured to mix a first frequency from a first LO with an intermediate frequency (IF) signal to down-convert said IF signal to a first sampling frequency band;
a second mixer upstream to said second ADC on said second signal path and configured to mix a second frequency from a second LO with said IF signal to down-convert said IF signal to a second sampling frequency band, said first and second LO frequencies being greater than the ADC common clock frequency and selected in accordance with the IF signal frequency bands such that an overlapping band of frequencies of said IF signal fall within said first sampling frequency band and within said second sampling frequency band when said IF signals on said parallel signal paths are down-converted by said first and second LO frequencies,
wherein each of said first ADC and said second ADC is configured to sample said overlapping band of frequencies; and wherein outputs from said first ADC and said second ADC are coherently summed to produce a summed receiver output for said overlapping band of frequencies;
a first down-converter coupled to the output of said first ADC;
a second down-converter coupled to the output of said second ADC;
said first and second down-converters configured to down-convert output signals from said first and second ADCs to baseband;
a first equalizer coupled to the output of the first down-converter;
a second equalizer coupled to the output of the second down-converter; and
a summing circuit coupled to the output of each said equalizer for coherently combining the outputs of said first and second ADCs to produce the RF receiver output for sampled frequencies falling within said overlapping band of frequencies.

14. In a receiver a method comprising:
receiving an intermediate frequency (IF) input signal along two parallel signal paths;
down-converting said IF input signal on the first of said two parallel signal paths to a first sampling frequency band of operation of a first analog to digital converter (ADC) by mixing with a first frequency from a first local oscillator (LO) associated with the first ADC on the first path;
down-converting said IF input signal on the second of said two parallel signal paths to a second sampling frequency band of operation of a second analog to digital converter (ADC) by mixing with a second frequency from a second LO associated with the second ADC on the second path, wherein said first frequency band of operation includes a band of frequencies that overlap said second frequency band of operation;
sampling said first frequency band of operation using said first ADC to produce a first digital output signal;
sampling said second frequency band of operation using said second ADC to produce a second digital output signal, said first ADC and second ADC having a common ADC clock signal having a frequency less than said LO1 and LO2 frequencies;

processing said first and second digital output signals, including coherently summing said digital output signal of said first ADC and said digital output signal of said second ADC for frequencies that fall within said overlapping band of frequencies, to generate a combined output signal from the receiver having enhanced signal to noise ratio.

15. The method of claim 14, wherein the receiving an analog IF input signal along two parallel signal paths includes receiving a first RF input signal; band pass filtering the first RF input signal; and splitting the band pass filtered RF input signal via a splitter to generate the analog IF input signal received along two parallel signal paths.

16. The method of claim 15, wherein processing said first and second digital output signals further comprises:

down-converting the digital output signals of the first and second ADCs to baseband signals; and conditioning said baseband signals in an equalizer; prior to said coherent summing step.

17. The method of claim 16, wherein said IF frequency band signal has a bandwidth of about 2 GHz to about 6 GHz.

18. The method of claim 16, wherein said overlapping band of frequencies is about 100 MHz and an instantaneous bandwidth of said receiver is about 1 GHz.

19. The method of claim 16, further comprising, after said conditioning step, directly outputting from said receiver a first output signal representing extended frequency channels for non-overlapping frequencies that fall within the operating of the first ADC;

directly outputting from said receiver a second output signal representing extended frequency channels for non-overlapping frequencies that fall within the operating of the second ADC.

* * * * *